US012660302B2

(12) United States Patent
Kim et al.

(10) Patent No.: US 12,660,302 B2
(45) Date of Patent: Jun. 16, 2026

(54) SEMICONDUCTOR DEVICE INCLUDING MOSFET REGION AND DIODE REGION AND MANUFACTURING METHOD THEREOF

(71) Applicant: DB HiTek Co., Ltd., Bucheon-si (KR)

(72) Inventors: Seung Hyun Kim, Bucheon-si (KR); Hee Bae Lee, Bucheon-si (KR); Jae Yuhn Moon, Bucheon-si (KR); Soon Jong Park, Bucheon-si (KR)

(73) Assignee: DB HiTek Co., Ltd., Bucheon (KR)

( * ) Notice: Subject to any disclaimer, the term of this patent is extended or adjusted under 35 U.S.C. 154(b) by 369 days.

(21) Appl. No.: 18/301,303

(22) Filed: Apr. 17, 2023

(65) Prior Publication Data

US 2024/0128260 A1 Apr. 18, 2024

(30) Foreign Application Priority Data

Oct. 18, 2022 (KR) ........................ 10-2022-0133652

(51) Int. Cl.
| | |
|---|---|
| *H10D 84/80* | (2025.01) |
| *H10D 8/60* | (2025.01) |
| *H10D 30/01* | (2025.01) |
| *H10D 30/60* | (2025.01) |
| *H10D 64/62* | (2025.01) |
| *H10D 64/64* | (2025.01) |

(52) U.S. Cl.
CPC ............. *H10D 84/811* (2025.01); *H10D 8/60* (2025.01); *H10D 30/051* (2025.01); *H10D 30/615* (2025.01); *H10D 64/62* (2025.01); *H10D 64/64* (2025.01)

(58) Field of Classification Search
CPC .. H10D 30/051; H10D 30/615; H10D 30/662; H10D 62/106; H10D 62/157; H10D 62/8325; H10D 64/62; H10D 64/64; H10D 8/60–605; H10D 8/051; H10D 84/811–817; H10D 62/364; H10D 84/611–619; H10D 84/403–409
See application file for complete search history.

(56) References Cited

U.S. PATENT DOCUMENTS

| | | | | |
|---|---|---|---|---|
| 9,786,778 | B1 * | 10/2017 | Morizuka | ............ H10D 64/519 |
| 10,164,020 | B2 | 12/2018 | Chun et al. | |
| 10,930,797 | B2 * | 2/2021 | Chun | ..................... H10D 62/13 |
| 2009/0072301 | A1 | 3/2009 | Bhalla et al. | |
| 2014/0175559 | A1 | 6/2014 | Hung et al. | |
| 2018/0166539 | A1 | 6/2018 | Chun et al. | |
| 2022/0293783 | A1 * | 9/2022 | Sugawara | ............ H10D 84/144 |

FOREIGN PATENT DOCUMENTS

| | | | | | |
|---|---|---|---|---|---|
| JP | 2016009712 | A * | 1/2016 | ........... | H10D 30/668 |
| KR | 10-1896332 | B1 | 9/2018 | | |

* cited by examiner

*Primary Examiner* — Shahed Ahmed
(74) *Attorney, Agent, or Firm* — Central California IP Group, P.C.; Andrew D. Fortney

(57) ABSTRACT

Disclosed are a semiconductor device (1) including a MOSFET region and an integrated diode region, and a manufacturing method thereof. More particularly, a semiconductor device (1) including a silicon carbide (SiC) MOSFET region and an integrated Schottky bather diode that reduce forward voltage drop (Vf), device area, and switching oscillation resulting from parasitic inductance are disclosed.

20 Claims, 10 Drawing Sheets

SEMICONDUCTOR DEVICE INCLUDING MOSFET REGION AND DIODE REGION AND MANUFACTURING METHOD THEREOF

CROSS REFERENCE TO RELATED APPLICATION

The present application claims priority to Korean Patent Application No. 10-2022-0133652, filed Oct. 18, 2022, the entire contents of which are incorporated herein for all purposes by this reference.

BACKGROUND OF THE INVENTION

Field of the Invention

The present disclosure relates generally to a semiconductor device including a MOSFET and a diode and a manufacturing method thereof. More particularly, the present disclosure relates to a semiconductor device including a MOSFET and a diode and a manufacturing method thereof, including a silicon carbide (SiC) MOSFET and an integrated Schottky barrier diode that reduced the forward voltage drop (Vf) and the device area, and prevent switching oscillation caused by parasitic inductance.

Description of the Related Art

Silicon carbide (SiC) is a material having a wider energy bandgap, a higher dielectric field, a higher saturated electron drift velocity, and higher thermal conductivity than silicon. Due to these excellent properties, SiC is attracting attention as a semiconductor material for high-temperature, high-voltage device applications.

A typical power metal-oxide-semiconductor field-effect transistor (power MOSFET) device has a body diode and uses the body diode as a free-wheeling diode during switching, so the use of a Schottky barrier diode is not essential. However, in the case of a SiC MOSFET device, it has higher forward voltage drop (Vf) characteristics than a Si MOSFET device due to its intrinsic high energy band gap and high built-in potential.

Due to such high forward voltage drop, the SiC MOSFET device consumes a relatively large amount of power during switching compared to a Si MOSFET of the same voltage rating, and power consumption inevitably increases as the voltage rating increases. Therefore, for applications where power consumption is important, a SiC Schottky barrier diode may be connected in parallel with the SiC MOSFET device and used externally (see FIG. 1A) or co-packaged as a discrete device with the SiC MOSFET device (see FIG. 1B). However, the use of such a discrete Schottky barrier diode may result in an increase in manufacturing cost, additional space consumption, and switching oscillation caused by parasitic inductance.

To overcome the above problems, the present inventors have conceived a novel semiconductor device including a MOSFET and a diode and a manufacturing method thereof, which will be described in detail later.

The foregoing is intended merely to aid in the understanding of the background of the present disclosure, and is not intended to mean that the present disclosure falls within the purview of the related art that is already known to those skilled in the art.

Documents of Related Art:
Korean Patent No. 10-1896332, entitled "SEMICONDUCTOR DEVICE AND METHOD MANUFACTURING THE SAME."

SUMMARY OF THE INVENTION

Accordingly, the present disclosure has been made keeping in mind the above problems occurring in the related art, and an objective of the present disclosure is to provide a semiconductor device including a MOSFET and a diode and a manufacturing method thereof, including a silicon carbide (SiC) MOSFET and an integral Schottky barrier diode that reduce the forward voltage drop (Vf) reduction, manufacturing cost, and product size (area), and stabilize the switching waveform and reduce oscillation by reducing or eliminating parasitic inductance.

Another objective of the present disclosure is to provide a semiconductor device including a MOSFET and a diode and a manufacturing method thereof, in which unit cells having a hexagonal shape (e.g., in a plan or layout view) form a honeycomb structure in order to compensate for the area loss due to the Schottky barrier diode and increase the channel density.

Still another objective of the present disclosure is to provide a semiconductor device including a MOSFET and a diode and a manufacturing method thereof, including a JFET region surrounding lower portions of a well and a high concentration impurity region to distribute current through an additional current path and thus improve the resistance characteristics of the device.

In order to achieve the above objectives, according to one aspect of the present disclosure, there is provided a semiconductor device including a substrate having a MOSFET region and a Schottky barrier diode (SBD) region; a lightly doped second conductivity type drift region on the substrate in the MOSFET region and the SBD region; a first conductivity type well in the drift region and in the MOSFET region; a heavily doped second conductivity type source in the well; a gate in the MOSFET region and including a gate insulating film on the drift region and a gate electrode on the gate insulating film; and a JFET region in the drift region and below the gate.

According to another aspect of the present disclosure, the JFET region may surround or be in contact with one sidewall and a lower portion (e.g., a lowermost surface) of the well.

According to another aspect of the present disclosure, the semiconductor device may further include a first high concentration impurity region in contact with the source and the well in the MOSFET region and the JFET region, the first high concentration impurity region having a first conductive type; and a first ohmic contact in contact with at least part of the source and the first high concentration impurity region.

According to another aspect of the present disclosure, the semiconductor device may further include a second high concentration impurity region in the drift region and in the SBD region, the second high concentration impurity region having the first conductivity type.

According to another aspect of the present disclosure, the semiconductor device may further include a second ohmic contact on the second high concentration impurity region in the SBD region.

According to another aspect of the present disclosure, the semiconductor device may further include a contact region on the drift region in the SBD region.

According to another aspect of the present disclosure, there is provided a semiconductor device including a substrate having a plurality of MOSFET regions and at least one Schottky barrier diode (SBD) region; a lightly doped second conductivity type drift region on the substrate in the MOS-FET region and the SBD region; and a plurality of unit cells having a first substantially hexagonal shape (e.g., in a plan or layout view) and at least partially having a honeycomb structure, the unit cells comprising the MOSFET regions; wherein the at least one SBD region is between at least two of the unit cells and has a second substantially hexagonal shape (e.g., in the plan or layout view).

According to another aspect of the present disclosure, each of the unit cells may include a gate having a third substantially hexagonal shape (e.g., in the plan or layout view); a well in the drift region and below the gate; a source in contact with the well in the drift region; a first high concentration impurity region surrounded by the source in the drift region, the first high concentration impurity region having a first conductivity type; and a JFET region in the drift region and below the gate.

According to another aspect of the present disclosure, the semiconductor device may comprise two or more of the SBD regions, and the SBD regions may not be in contact with each other.

According to another aspect of the present disclosure, each of the SBD regions may have six outer surfaces in contact with respective unit cells.

According to another aspect of the present disclosure, each of the SBD regions may include a second high concentration impurity region in the drift region, the second high concentration impurity region having the first conductivity type; and a second ohmic contact on the second high concentration impurity region.

According to another aspect of the present disclosure, the semiconductor device may further include a source metal or source electrode covering the gate (e.g., on the drift region); and a drain metal or drain electrode under the substrate.

According to another aspect of the present disclosure, there is provided a semiconductor device including a substrate having a plurality of MOSFET regions and at least one Schottky barrier diode (SBD) region; a lightly doped second conductivity type drift region on the substrate in the MOS-FET regions and the at least one SBD region; and a plurality of unit cells having a first substantially hexagonal shape (e.g., in a plan or layout view) and at least a partial honeycomb structure, and arranged in n columns, the unit cells comprising the MOSFET regions; wherein the at least one SBD region is between at least two of the unit cells, has a second substantially hexagonal shape (e.g., in the plan or layout view), and may not be in adjacent ones of the n columns.

According to another aspect of the present disclosure, each SBD region may be directly surrounded by a subset of the plurality of unit cells.

According to another aspect of the present disclosure, the semiconductor device may comprise a plurality of the SBD regions, and the SBD regions may alternate with the unit cells in at least one of the n columns.

According to another aspect of the present disclosure, the SBD regions may have an area equal to or less than 25% or less of a total area of an active region (e.g., of the semiconductor device).

According to another aspect of the present disclosure, the semiconductor device may further include a heavily doped first conductivity type impurity region in the drift region (or at a surface thereof) and in a center of each of the SBD regions.

According to another aspect of the present disclosure, there is provided a method of manufacturing a semiconductor device, including forming a drift region on a substrate; forming unit cells in n columns, the unit cells comprising MOSFET regions; and forming SBD regions, wherein forming the unit cells may include forming second conductivity type JFET regions having a substantially hexagonal shape (e.g., in the plan or layout view) in the drift region and in the MOSFET regions; forming first conductivity type wells in the JFET regions; forming first high concentration impurity regions in the JFET regions at positions in contact with the wells, the first high concentration impurity regions having a first conductivity type; forming first heavily doped second conductivity type sources in the wells; forming second sources in the drift region; and forming gates having a substantially hexagonal shape (e.g., in the plan or layout view) on the JFET regions, the wells, wherein the sources have at least a partial honeycomb structure.

According to another aspect of the present disclosure, the SBD regions may not be in contact with each other.

According to another aspect of the present disclosure, the SBD regions may not be in consecutive ones of the n columns.

The above configurations may provide the following effects.

The integral silicon carbide (SiC) MOSFET and Schottky barrier diode reduce forward voltage drop (Vf), manufacturing cost, and product size/area, and stabilize switching waveforms and reduce oscillation by reducing or eliminating parasitic inductance (e.g., between the SiC MOSFET and the Schottky barrier diode).

In addition, by providing the unit cells with a hexagonal shape and/or a honeycomb structure, one may compensate for any area loss resulting from the Schottky barrier diode with an increase in the channel density.

By surrounding the lower portions of the well and the high concentration impurity region with the JFET region, current distribution through formation of an additional current path can be achieved, and thus, the resistance of the device can be improved.

Meanwhile, the effects of the present disclosure are not limited to those described above, and other effects not stated explicitly may be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1A:
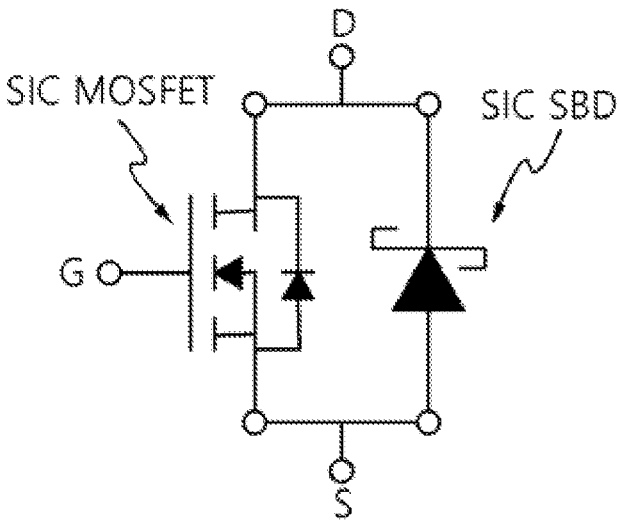
FIGS. 1A and 1B are reference views illustrating the use of a SiC Schottky barrier diode in or with a conventional SiC MOSFET device.

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure and to fully convey the scope of the present disclosure to those skilled in the art.

As used herein, the singular forms may include the corresponding plural forms as well, unless the context clearly indicates otherwise. It will be further understood that the terms "comprise" and/or "comprising", etc. when used herein specify the presence of stated features, integers, steps, operations, elements, components, and/or combinations thereof, but do not preclude the presence or addition of one or more other features, integers, steps, operations, elements, components, and/or combinations thereof.

As used herein, when an element (or layer) is referred to as being on another element (or layer), it can be directly on the other element, or one or more intervening elements (or layers) may be therebetween. In contrast, when an element is referred to as being directly on or above another component, no intervening element is therebetween. Further, the terms "on", "above", "below", "upper", "lower", "one side", "side surface", etc. are used to describe one element's positional relationship to one or more other elements illustrated in the drawings.

Meanwhile, when an embodiment can be implemented differently, functions or operations described herein may occur in a different way from that described herein. For example, two consecutive functions or operations may be performed simultaneously, or the functions or operations may be performed in reverse sequence.

Hereinafter, a "first conductivity type" may refer to P-type doping, and a "second conductivity type" may refer to N-type doping. Alternatively, in some cases, the first conductivity type may be N-type, and the second conductivity type may be P-type, but the present disclosure not limited thereto.

Figure 2:
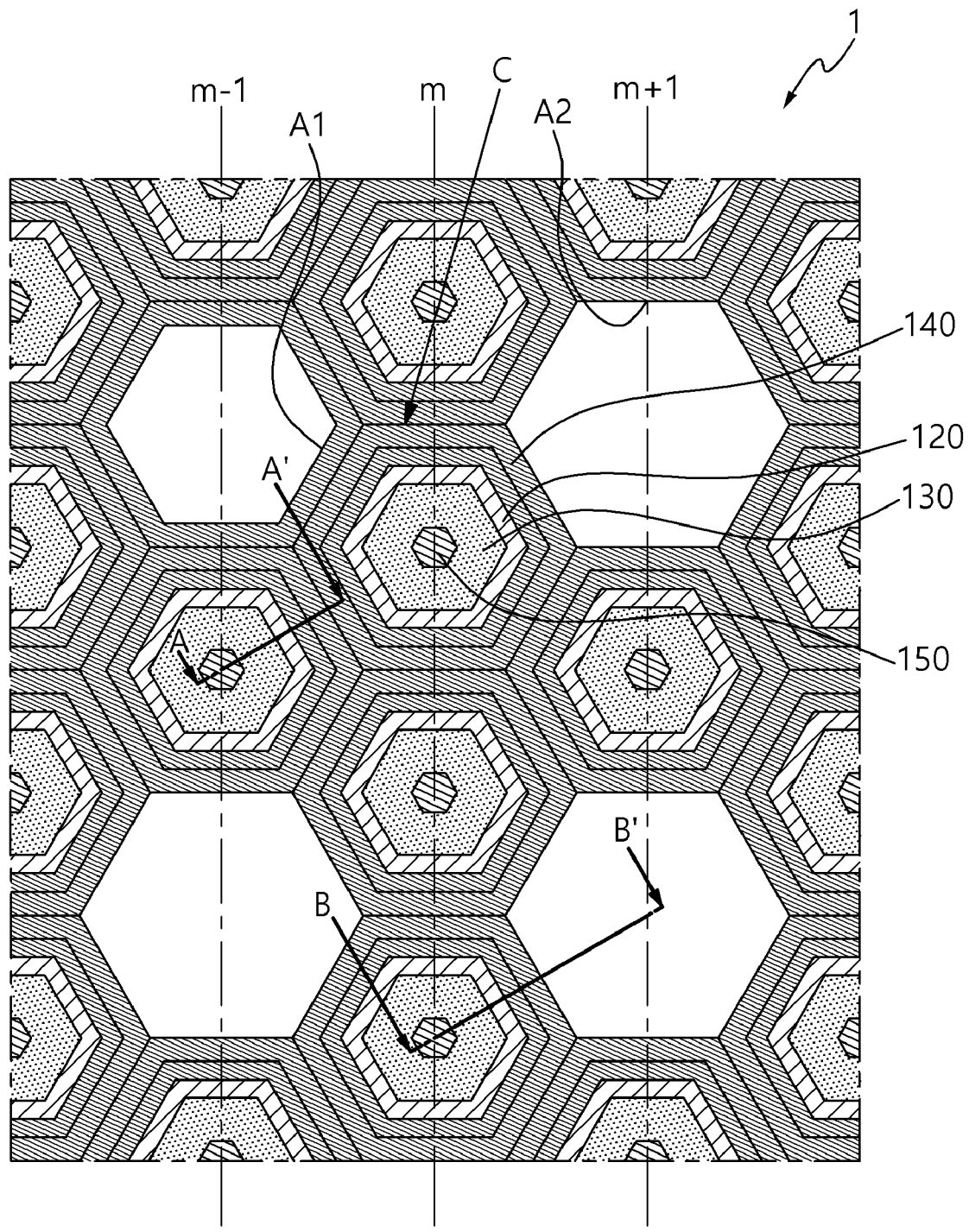
FIG. 2 is a plan or layout view illustrating a semiconductor device including a MOSFET region and a diode region according to an embodiment of the present disclosure.
Figure 3:
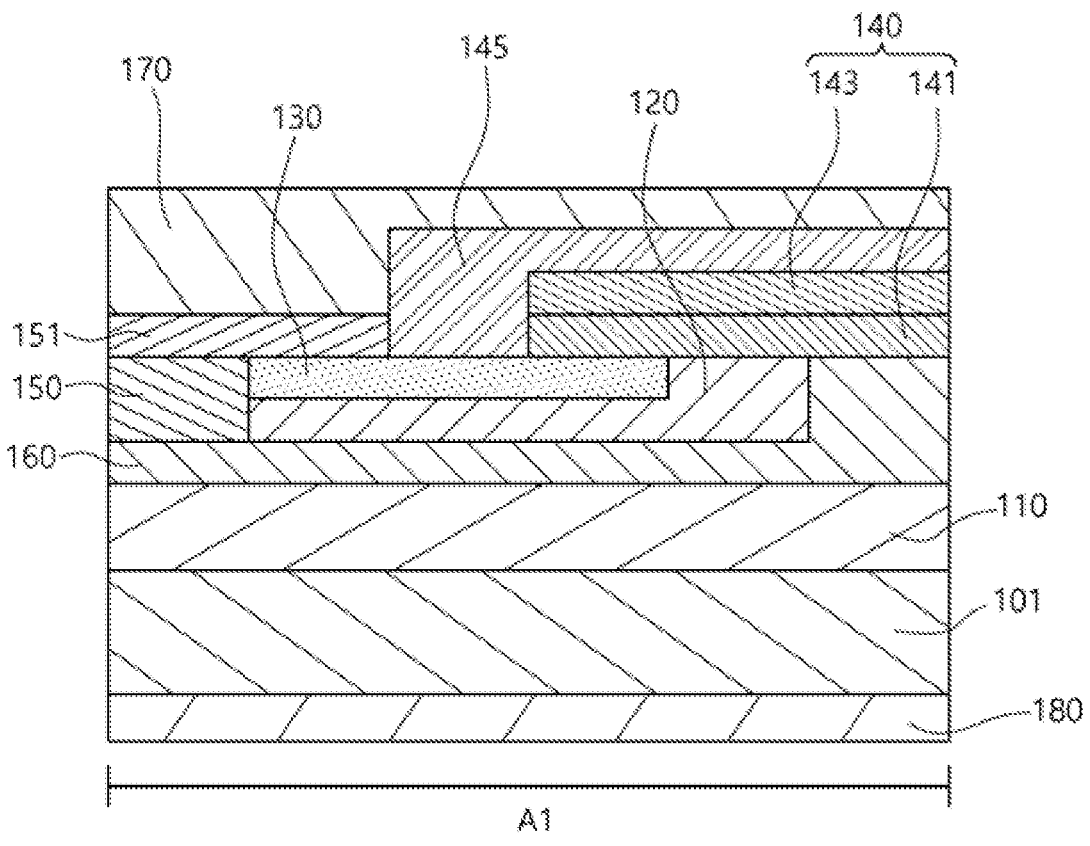
FIG. 3 is a cross-sectional view illustrating the semiconductor device including an integrated MOSFET and diode illustrated in FIG. 2, taken along line A-A'.
Figure 4:
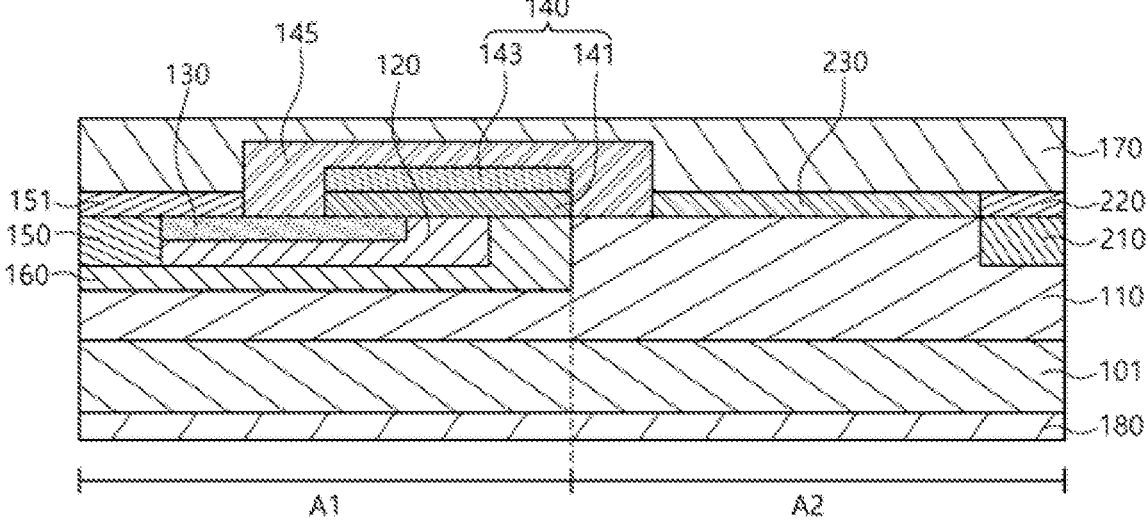
FIG. 4 is a cross-sectional view illustrating the semiconductor device including the MOSFET and the diode illustrated in FIG. 2, taken along line B-B'.
Figure 5:
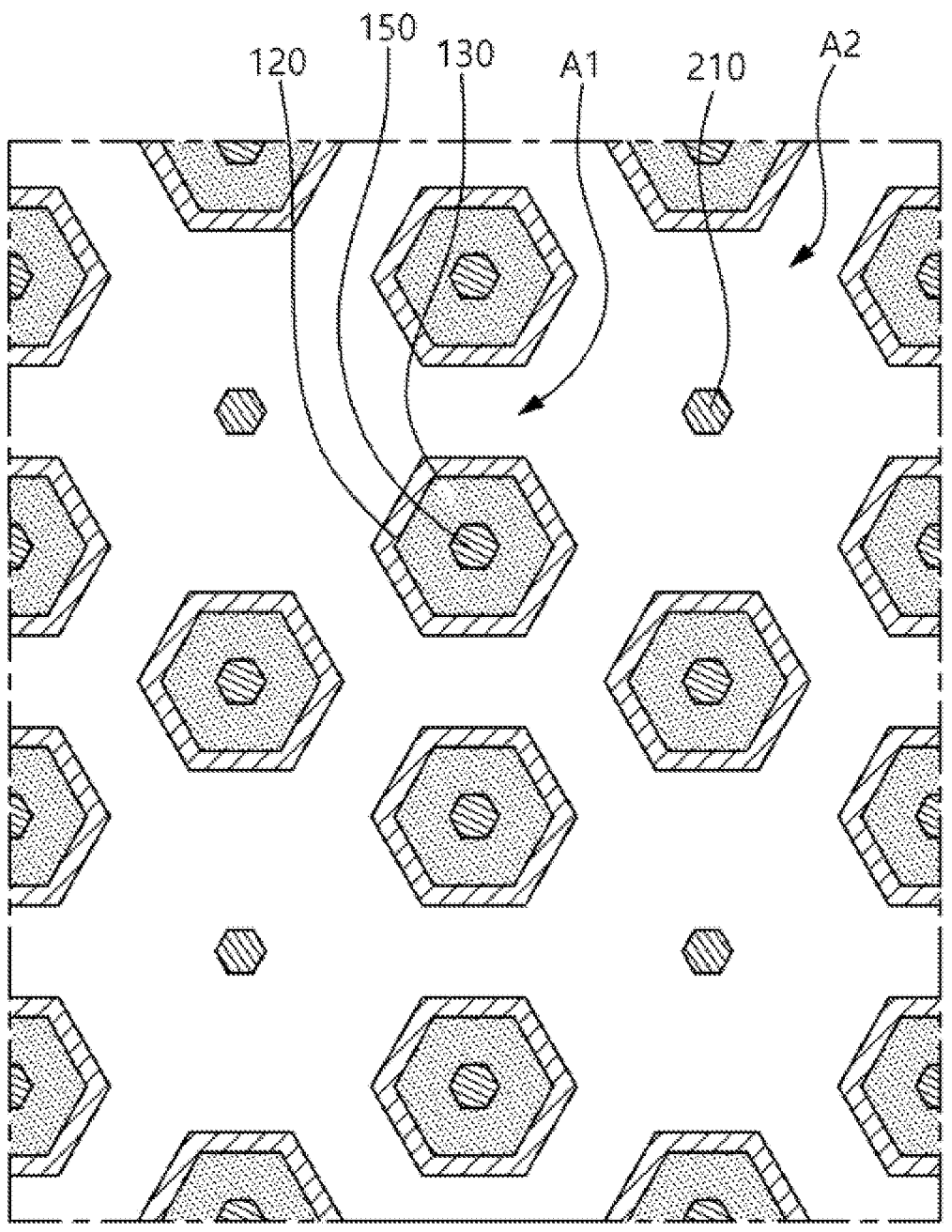
FIG. 5 is a plan or layout view illustrating only first high concentration impurity regions, sources, and wells in the semiconductor device illustrated in FIG. 2.
Figure 6:
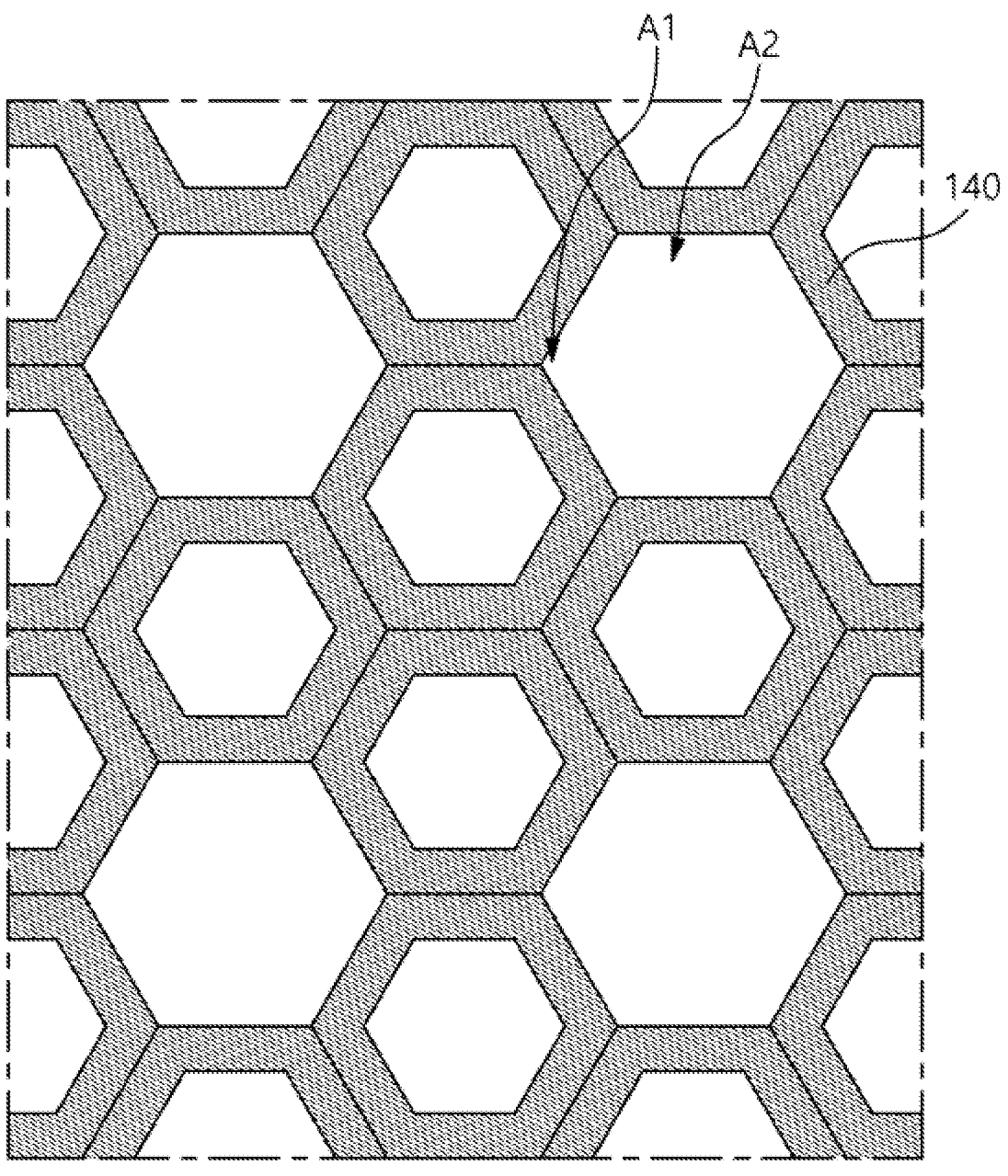
FIG. 6 is a plan view illustrating only gates in the semiconductor device illustrated in FIG. 2.

FIG. 2 is a plan view illustrating a semiconductor device 1 including one or more MOSFET regions and one or more integrated diode regions according to an embodiment of the present disclosure; FIG. 3 is a cross-sectional view illustrating the semiconductor device 1 taken along line A-A' of FIG. 2; FIG. 4 is a cross-sectional view illustrating the semiconductor device taken along line B-B' of FIG. 2; FIG. 5 is a plan view illustrating only first high concentration impurity regions 150, sources 130, and wells 120 in the semiconductor device 1 illustrated in FIG. 2; and FIG. 6 is a plan view illustrating only gates 140 in the semiconductor device 1 illustrated in FIG. 2.

Hereinafter, the semiconductor device 1 including integrated MOSFET and diode regions according to one or more embodiments of the present disclosure will be described in detail with reference to the accompanying drawings.

Referring to FIGS. 2 to 6, the present disclosure relates generally to the semiconductor device 1 including integrated SiC MOSFET and Schottky barrier diode regions. More particularly, the present disclosure relates to the semiconductor device 1 including the MOSFET and diode regions, including silicon carbide (SiC) MOSFET region A1 and an integrated Schottky barrier diode (SBD) region A2 that reduces forward voltage drop (Vf), device area, and switching oscillation caused by parasitic inductance (e.g., between the SiC MOSFET and the Schottky barrier diode).

A first region A1 serving as a MOSFET region and a second region A2 serving as a Schottky barrier diode region are in the device 1, which will be described later.

Referring to FIGS. 3 and 4, a substrate 101 may include, for example, a silicon carbide (SiC) wafer heavily doped with a second conductivity type impurity. In more detail, the substrate 101 may be or comprise, for example, a 4H—SiC or 6H—SiC substrate. The second conductivity type impurity in the heavily doped substrate 101 may include, for example, phosphorus.

A drift region 110 may be on the substrate 101. The drift region 110 may include, for example, a SiC epitaxial layer grown on the SiC single crystal substrate 101 that maintains a specific crystalline orientation with respect to the crystal lattice of the substrate 101. The drift region 110 may be formed by, for example, chemical vapor deposition (CVD), but is not limited thereto, and may be formed by various other processes such as molecular beam epitaxy (MBE), sublimation epitaxy, and liquid phase epitaxy.

In addition, the drift region 110 may be or comprise a lightly doped second conductivity type impurity region having a lower doping concentration than the substrate 101, and may include, for example, phosphorus as the second conductivity type impurity. The drift region 110 may be in both the first region A1 and the second region A2.

In the first region A1, a well 120 may be in a surface of the drift region 110 or a junction gate field-effect transistor (JFET) region 160 which will be described later. The well 120 may be or comprise a first conductivity type doped impurity region. A channel region may form in the well 120. In addition, a source 130 may be in the well 120. The source 130 may be or comprise a heavily doped second conductivity type impurity region. Here, the source 130 may have a higher doping concentration than the drift region 110.

In addition, the source 130 may be in contact with a lower portion or a lowermost surface of a gate 140, which will be described later. The source 130 may be in the first region A1. When a MOSFET of the semiconductor device 1 operates, a channel may form in the well 120 to secure a path for movement of carriers (e.g., electrons). Thus, electrons from a source electrode (which will be described later) may move to a drain metal or drain electrode 180 which will be described later, through the source 130 and the well 120, below a gate electrode 143.

In addition, in the first region A1, the gate 140 may be on the substrate 101 or the drift region 110. The gate 140 may be on the drift region 110 and may at least partially overlap the well 120 and the source 130.

The gate 140 may include a gate oxide film 141 on the drift region 110 and the gate electrode 143 on the gate oxide film 141. Thus, a lowermost surface of the gate oxide film 141 may be in contact with the well 120 and the source 130. The gate electrode 143 may be or comprise, for example, polysilicon doped with an impurity. In addition, an insulating film 145 may surround or cover the gate electrode 143 and the gate oxide film 141. The insulating film 145 may also cover sidewalls of the gate electrode 143 and the gate oxide layer 141 and may at least partially cover an upper surface of the gate electrode 143. The gate 140 may have a hexagonal shape in a plan or layout view, rather than a rectangular shape, and a detailed description thereof will be described later.

Next, in the first region A1, a high concentration impurity region 150 may be in the drift region 110 or the JFET region 160. The high concentration impurity region 150 may be in the drift region 110 and may be in contact with the well 120 and the source 130. For example, the high concentration impurity region 150 may be or comprise a heavily doped first conductivity type impurity region, and may be in contact with the sidewall of each of the well 120 and the source 130 distal from the gate 140. In addition, an ohmic contact 151 in contact with a source metal or source electrode 170 may be on at least portions of uppermost surfaces of the high concentration impurity region 150 and the source 130. The ohmic contact 151 may comprise, but is not limited to, Ti or TiN.

In addition, in the first region A1, the JFET region 160 may be in the drift region 110. The JFET region 160 may be below the gate 140 in the drift region 110. For example, the JFET region 160 may be or comprise a second conductivity type doped impurity region, and preferably has a higher doping concentration than the drift region 110, but a lower doping concentration than the source 130. In addition, the JFET region 160 is preferably below the gate 140 and adjacent to the channel region of the well 120. That is, the JFET region 160 may be in contact with a sidewall of the well 120 adjacent to the gate 140.

In addition, the JFET region 160 may surround the well 120 and the high concentration impurity region 150. That is, the JFET region 160 may be deeper than the lowermost surface of the well 120 and the high concentration impurity region 150 in the drift region 110, and may at least partially surround the well 120 and the high concentration impurity region 150. By forming the JFET region 160 in this manner, when a current moves from the drain metal 180 to the source metal 170, the current can move through the JFET region 160 along a path below the gate 140, as well as a path below the well 120 and the high concentration impurity region 150. The additional current path facilitates or improves current distribution. This results in improving resistance characteristics of the device 1.

In addition, the source metal or source electrode 170 may be on the substrate 101 or the drift region 110 in the first region A1 and the second region A2. The source metal 170 may be on the drift region 110 and may cover the insulating film 145 and the ohmic contact 151, and may extend to the second region A2. The source metal 170 may include, but is not limited to, Al or an Al alloy.

In addition, the drain metal or drain electrode 180 may be under or on an opposite surface of the substrate 101. The drain metal 180 may be electrically connected to a drain terminal D. The drain metal 180 may include, but is not limited to, Ni or Ag. The drain metal 180 may be in both the first region A1 and the second region A2.

In addition, a high concentration impurity region 210 may be in the drift region 110 in the second region A2. For convenience of description, the above-described high concentration impurity region 150 is referred to as a "first high concentration impurity region 150", and the high concentration impurity region 210 in the second region A2 is referred to as a "second high concentration impurity region 210". The second high concentration impurity region 210 may be formed substantially simultaneously with the first high concentration impurity region 150 (e.g., in the same processing steps), but is not limited thereto. Thus, the second high concentration impurity region 210 may be or comprise a heavily doped first conductivity type impurity region. However, it should be noted that the second high concentration impurity region 210 is not an essential component of the present disclosure.

In addition, an ohmic contact 220 may be on the second high concentration impurity region 210 or the drift region 110 in the second region A2. The ohmic contact 220 may include, but is not limited to, Ti or TiN. It should be also noted that the ohmic contact 220 is not an essential component of the present disclosure. For example, in the case of a merged pin Schottky (MPS) diode, the ohmic contact 220 may be on the second high concentration impurity region 210, but in the case of a junction barrier Schottky (JBS) diode, the ohmic contact 220 may not be on the second high concentration impurity region 210.

In addition, a contact region 230 may be on the drift region 110 in the second region A2 at a position adjacent to or in contact with the ohmic contact 220. The contact region 230 may be or comprise a metal layer, and may include, but is not limited to, Ni and/or Ti. The contact region 230 may improve bonding between the drift region 110 and the source metal 170.

Hereinafter, the problems of a conventional SiC MOSFET semiconductor device and the structure of the semiconductor device 1 including the integrated MOSFET and diode regions according to the present disclosure for solving the problems will be described in more detail with reference to the accompanying drawings.

A typical power metal-oxide-semiconductor field-effect transistor (power MOSFET) device has a body diode and uses the body diode as a free-wheeling diode during switching, so the use of a Schottky barrier diode is not essential. However, in the case of a SiC MOSFET device, it has higher forward voltage drop (Vf) characteristics than a Si MOSFET device due to its intrinsic high energy band gap and high built-in potential.

Figure 1B:
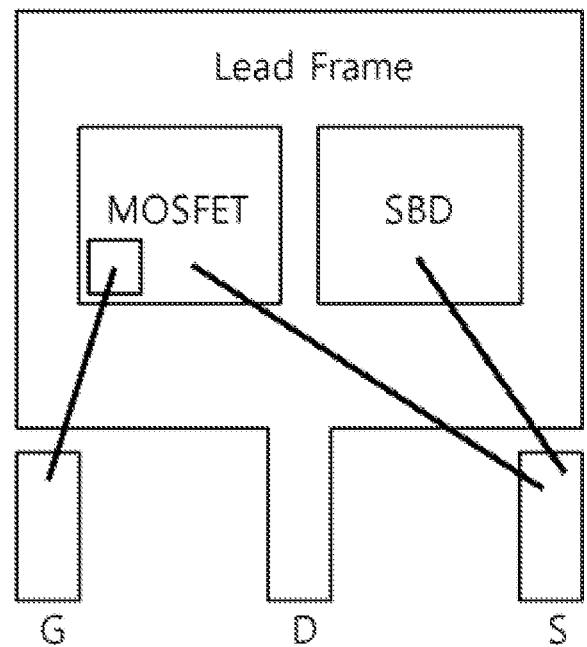

Due to such high forward voltage drop, the SiC MOSFET device consumes a relatively large amount of power during switching, compared to a Si MOSFET of the same voltage rating, and power consumption inevitably increases as the voltage rating increases. Therefore, for applications where power consumption is important, a SiC Schottky barrier diode may be connected in parallel with the SiC MOSFET device and is used externally (see FIG. 1A) or co-packaged as a discrete device with the SiC MOSFET device (see FIG. 1B). However, the use of such a discrete Schottky barrier diode may result in an increase in manufacturing cost, additional space consumption, and switching oscillation caused by parasitic inductance.

Referring to FIGS. 2 to 6, in order to solve the above problems, the device 1 according to embodiment(s) of the present disclosure includes the first region A1 serving as the MOSFET region and the second region A2 serving as the integral Schottky barrier diode region. However, the integration of the first region A1 and the second region A2 may disadvantageously reduce the channel density because the first region A1 and the second region A2 are in the same device area. This may be solved by arranging the components of the semiconductor device 1 in the MOSFET region and the diode region as follows, which will be described in detail below.

In the semiconductor device 1, the gate 140 may have a hexagonal shape (e.g., in the plan or layout view). Here, the semiconductor device 1 may include a plurality of hexagonal gates 140, which may be arranged in a honeycomb pattern, for example. With this structure, there may be no loss of space, so space utilization may increase. For example, when a plurality of unit cells C having a hexagonal shape are in contact with each other, they may form n columns.

All the unit cells C may have substantially the same shape in the plan or layout view and the same cross-sectional shape. In each of the unit cells C, the gate 140 may have, for example, a hexagonal shape (e.g., in the plan or layout view). In addition, the well 120 may be below the gate 140. In addition, the source 130 may be in the well 120 and in contact with the well 120. The source 130 may have, for example, a substantially hexagonal shape (e.g., in the plan or layout view). In addition, the first high concentration impurity region 150 may be in the center of the unit cell region C. The first high concentration impurity region 150 may have, for example, a substantially hexagonal shape (e.g., in the plan or layout view). Finally, the JFET region 160 may be below the gate 140. The JFET region 160 may have, for example, a substantially hexagonal shape (e.g., in the plan or layout view). However, it should be noted that the examples of the shape of each component in the plan or layout view (except for the gate 140) are not limited by the above examples.

Here, the second region A2 may not be in a specific column. That is, in an mth column (0<m<n), a plurality of unit cells C having substantially the same shape may repeat along the column direction.

In addition, the second region A2 may be in an m−1th and/or m+1th column adjacent to the unit cells C in the mth column. For example, the second region A2 and the first region A1 may alternate in the m−1th column and/or m+1th column along the column direction. That is, a column comprising sequential, alternating first regions A1 and second regions A2 may repeat, such that the outer surfaces of each hexagonal second region A2 are adjacent to or surrounded by respective unit cells C or first regions A1. However, the arrangement of the second regions A2 in the m−1th and/or m+1st column is not limited to the above example, and the second regions A2 may be at least partially repeated along the column direction. Alternatively, the first regions A1 may be repeated along the column direction.

With this structure, the MOSFET region A1 and the integral Schottky barrier diode region A2 may reduce the forward voltage drop (Vf), the manufacturing cost, and the product area, and stabilize the switching waveform and reduce oscillation by reducing or eliminating parasitic inductance. In addition, the unit cells C having a hexagonal shape and/or a honeycomb structure may compensate for the area loss resulting from the Schottky barrier diode region(s) A2 by an increase in the channel density.

Here, it is preferable that the area of the Schottky barrier diode A2 is equal to less than 25% of the total area of an active region (e.g., of the semiconductor device 1), but the scope of the present disclosure is not limited by the numerical range.

FIGS. 7 to 17 are cross-sectional views illustrating structures formed during a method of manufacturing a semiconductor device including integrated MOSFET and diode regions according to one or more embodiments of the present disclosure.

Hereinafter, the method of manufacturing the semiconductor device 1 including the integrated MOSFET and diode regions according to embodiment(s) of the present disclosure will be described in detail with reference to the accompanying drawings. It should be noted that the sequence of the steps of the manufacturing method is not limited to the order described below.

Figure 7:
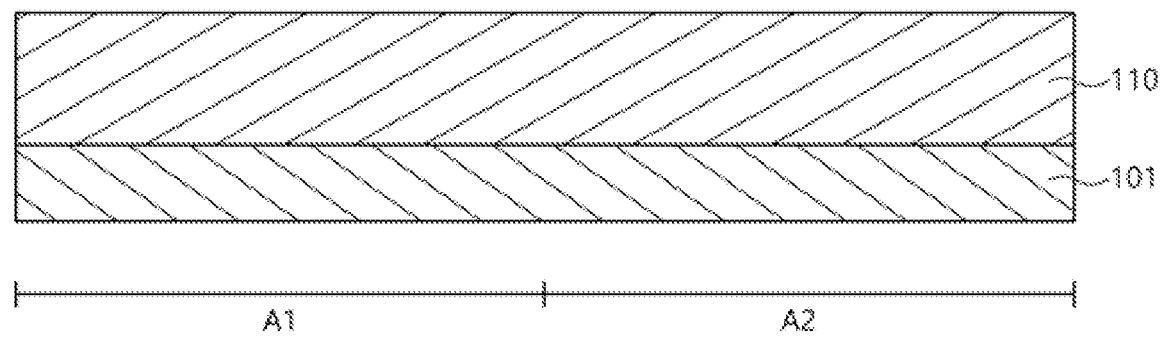
FIGS. 7 to 17 are cross-sectional views illustrating a method of manufacturing a semiconductor device including one or more MOSFET regions and one or more integrated diode regions according to one or more embodiments of the present disclosure.

Referring to FIG. 7, first, a drift region 110 may be formed on a substrate 101. The drift region 110 may be formed by epitaxial growth (e.g., of SiC) on the substrate 101. The drift region 110 may also be formed by, for example, chemical vapor deposition (CVD), but is not limited thereto, and may be formed by other various processes such as molecular beam epitaxy (MBE), sublimation epitaxy, and liquid phase epitaxy.

Figure 8:
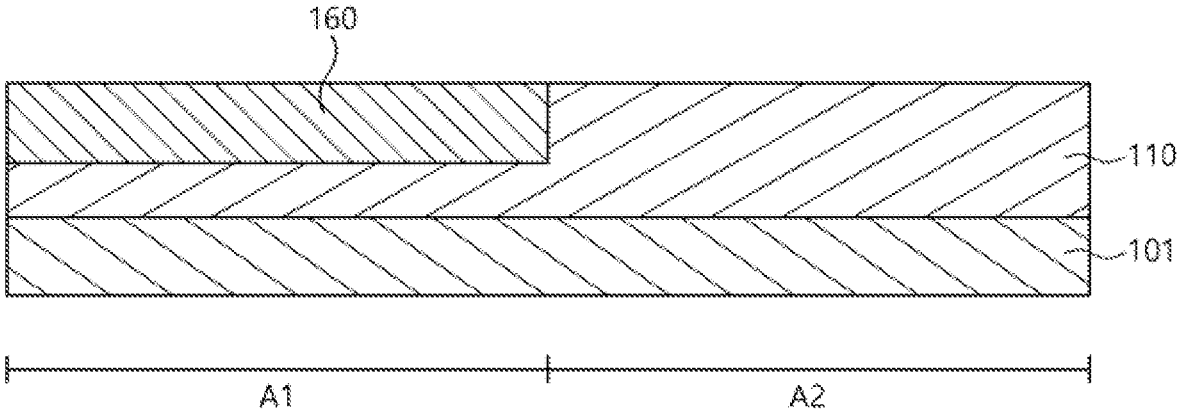

Then, referring to FIG. 8, a JFET region 160 may be formed in the drift region 110 (e.g., at or through a surface thereof) in a first region A1. The JFET region 160 may be formed by ion implantation in which a second conductivity type impurity is implanted through a mask pattern (e.g., a patterned photoresist; not illustrated). As described above, the JFET region 160 may be a second conductivity type heavily doped impurity region.

Figure 9:
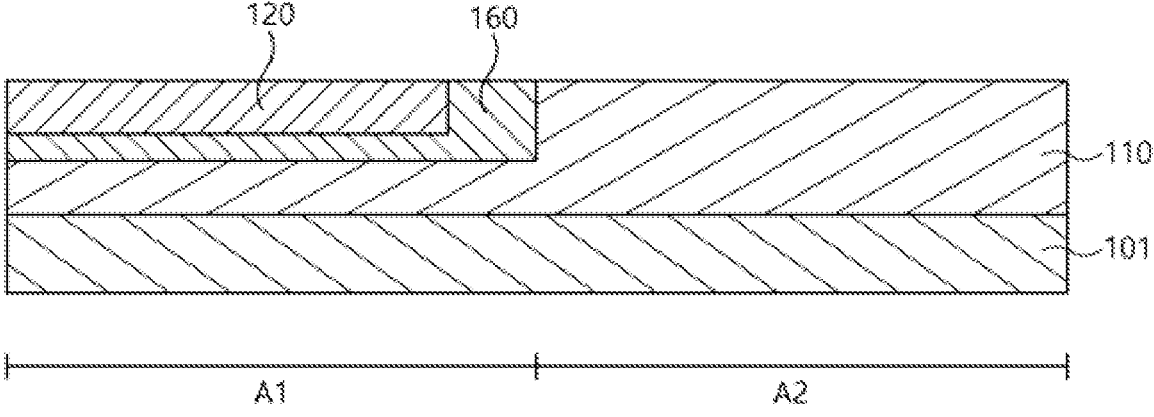

Then, referring to FIG. 9, a well 120 may be formed in the JFET region 160 (e.g., at or through a surface of the JFET region 160). The well 120 may be formed by ion implantation in which a first conductivity type impurity is implanted through a mask pattern (e.g., a second patterned photoresist; not illustrated). The well 120 is preferably doped with an impurity at a lower doping concentration than the first high concentration impurity region 150.

Figure 10:
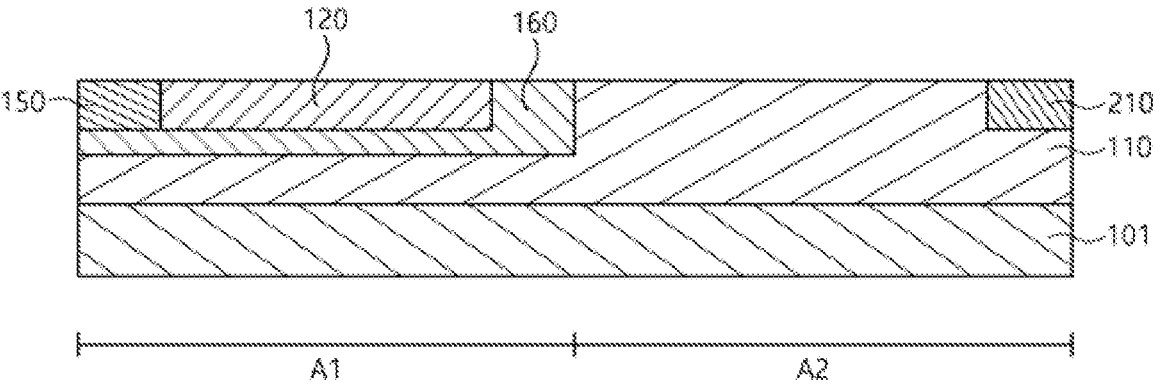

Then, referring to FIG. 10, the first high concentration impurity region 150 may be formed in the JFET region 160 (e.g., at or through a surface of the JFET region 160), in contact with the well 120 (e.g., a sidewall thereof). The first high concentration impurity region 150 may be a first conductivity type heavily doped impurity region, and may be formed by ion implantation in which a first conductivity type impurity is implanted through a mask pattern (e.g., a third patterned photoresist; not illustrated). When the first high concentration impurity region 150 is formed, a second high concentration impurity region 210 may be formed simultaneously in the drift region 110 in the second region A2 if necessary or desired.

Figure 11:
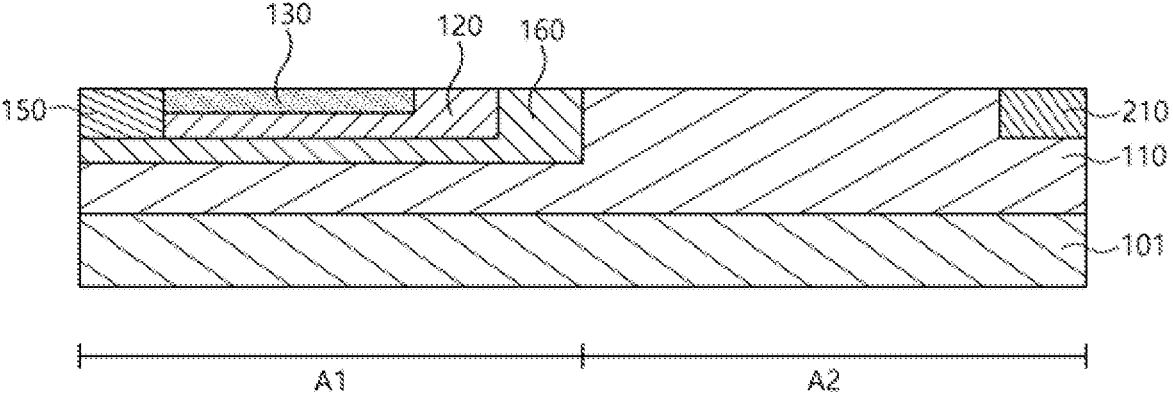

Then, referring to FIG. 11, a source 130 may be formed. The source 130 may be formed by ion implantation in which a second conductivity type impurity is implanted using a mask pattern (e.g., a fourth patterned photoresist; not illustrated). As described above, the source 130 may be a second conductivity type heavily doped impurity region. The source 130 is preferably formed in the well 120 (e.g., at or through a surface thereof).

Figure 12:
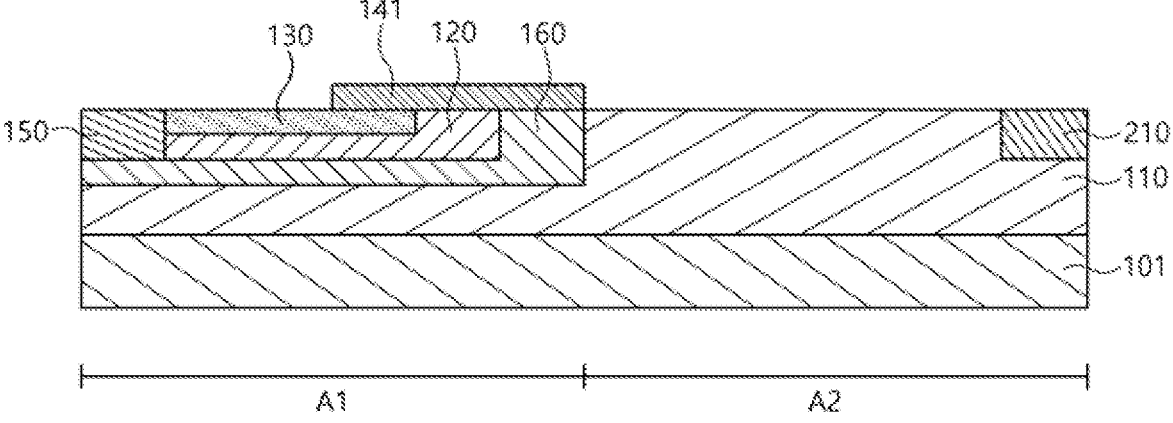

Then, referring to FIG. 12, a gate oxide film 141 may be formed on the drift region 110 or the JFET region 160. The gate oxide film 141 may be formed, for example, by blanket-depositing an oxide film or layer (not illustrated) on the well 120, the source 130, the first high concentration impurity region 150, the JFET region 160, and the drift region 110 (e.g., by CVD using a source gas such as tetraethyl orthosilicate [TEOS] or silane [SiH$_4$] in the presence of oxygen) and then etching the oxide film or layer using a mask pattern (e.g., a fifth patterned photoresist; not illustrated).

Figure 13:
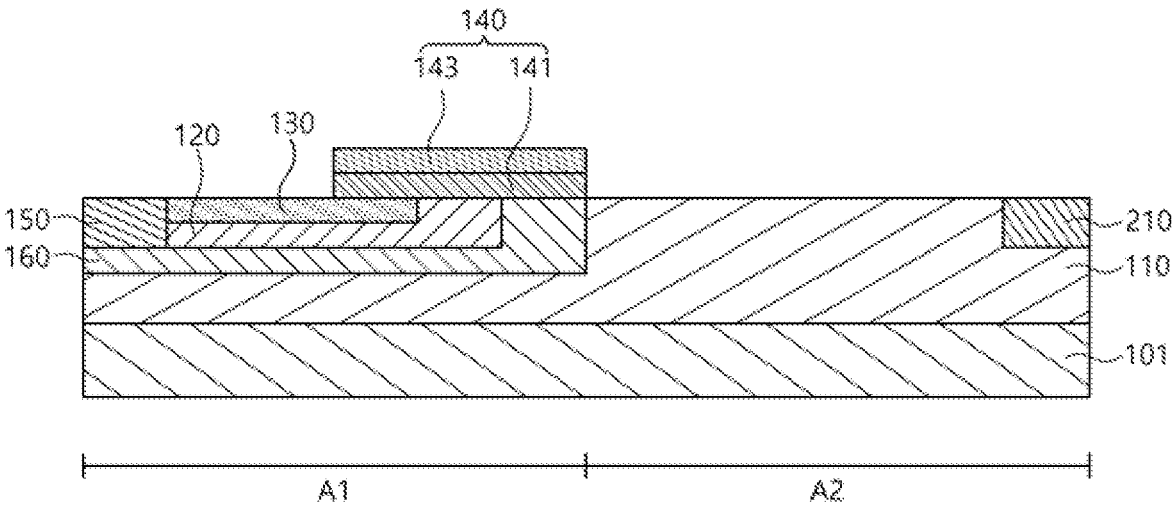

Then, referring to FIG. 13, a gate electrode 143 may be formed on the gate oxide film 141. The gate electrode 143 may be formed, for example, by blanket-depositing a doped polysilicon film (e.g., by CVD or physical vapor deposition [PVD]; not illustrated) on the drift region 110 and the gate oxide film 141 and then etching process the doped polysilicon film using a mask pattern (not illustrated). Alternatively, the oxide film or layer and the doped polysilicon film may be blanket-deposited in sequence, then sequentially etched using the same mask pattern.

Figure 14:
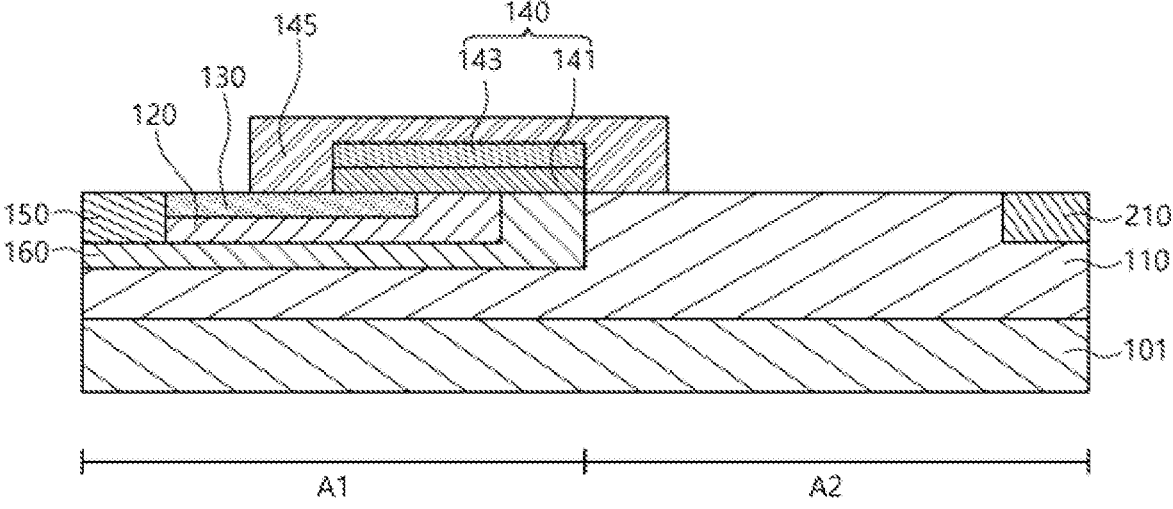

Then, referring to FIG. 14, an insulating film 145 surrounding the gate oxide film 141 and the gate electrode 143 may be formed. The insulating film 145 may be formed, for example, by blanket-depositing one or more insulating films such as an oxide film or layer (not illustrated) on the drift region 110, the gate oxide film 141, and the gate electrode 143 and then etching the one or more insulating films process using a mask pattern (e.g., a sixth patterned photoresist; not illustrated).

Figure 15:
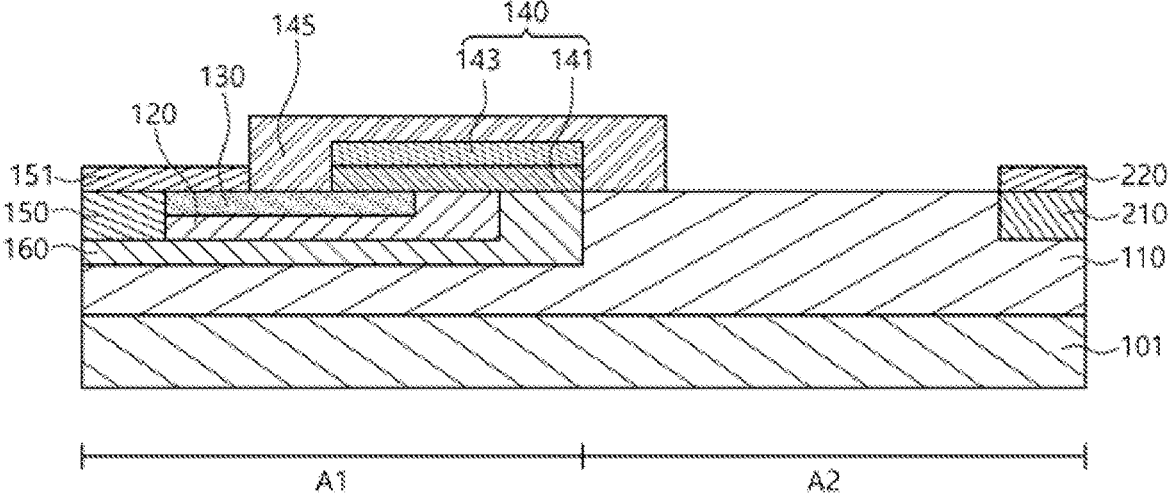

Then, referring to FIG. 15, an ohmic contact 151 may be formed in the first region A1. The ohmic contact 151 may be at least partially in contact with uppermost surfaces of the source 130 and the first high concentration impurity region 150, and may be formed, for example, by blanket-depositing a Ti or TiN layer (not illustrated) on the source 130, the first high concentration impurity region 150, and the insulating film 145, and then etching the Ti or TiN metal layer using a mask pattern (e.g., a seventh patterned photoresist; not shown). Here, an ohmic contact 220 may be formed simultaneously in the second region A2, if necessary or desired. The ohmic contact 220 in the second region A2 may be formed on the second high concentration impurity region 210.

Figure 16:
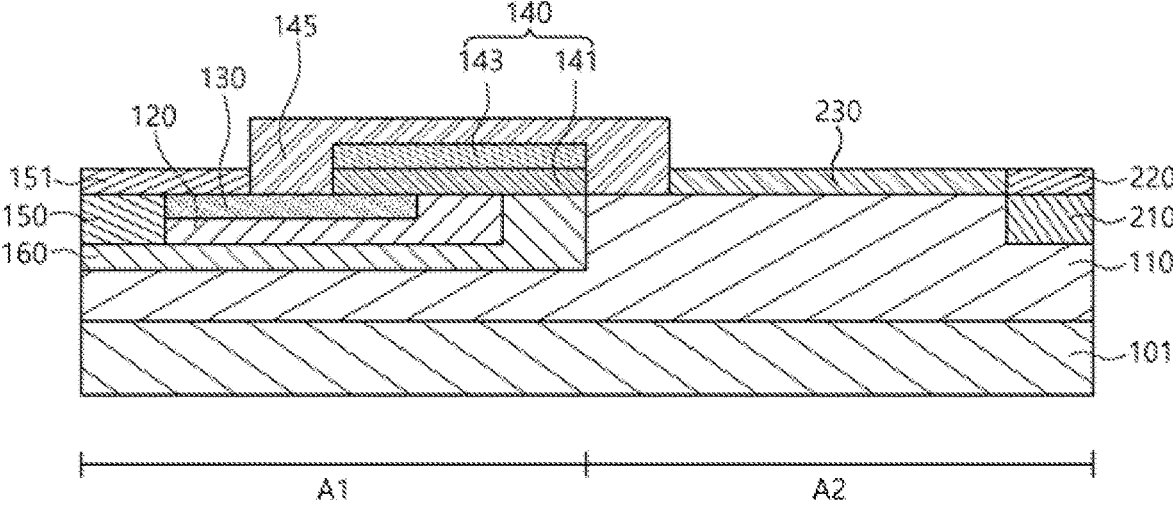

Then, referring to FIG. 16, a contact region 230 may be formed in the second region A2. The contact region 230 may be formed on the drift region 110. The contact region 230 may be formed, for example, by blanket-depositing a Ti or Ni metal layer (not illustrated) on the drift region 110 and then etching the Ti or Ni metal layer using a mask pattern (e.g., an eighth patterned photoresist; not illustrated).

Figure 17:
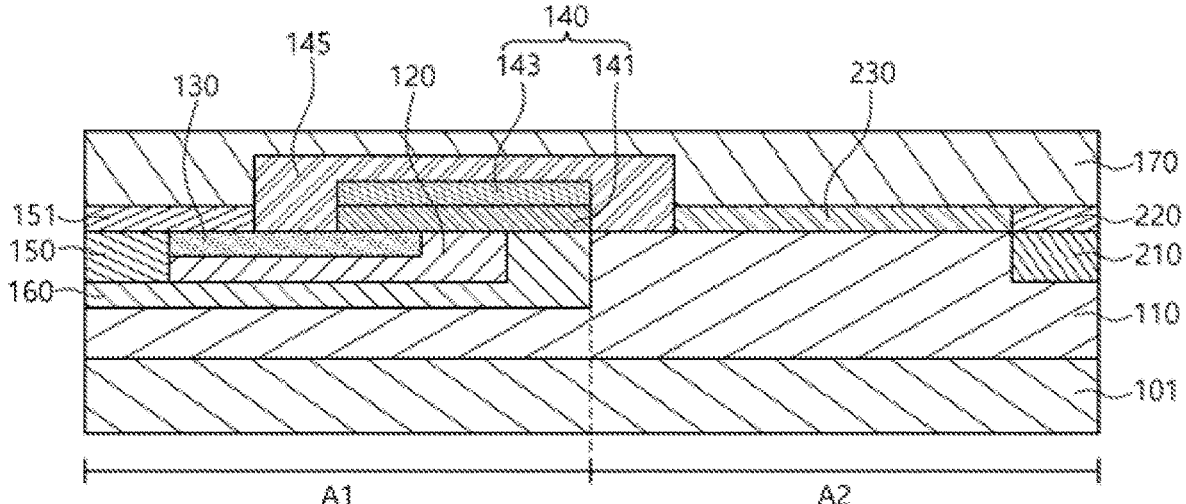

Finally, referring to FIG. 17, a source metal or source electrode 170 and a drain metal or drain electrode 180 may be formed. The source metal 170 may be or comprise a metal layer such as Al or an Al alloy, and the drain metal 180 may be or comprise a metal layer such as Ni or Ag. The source metal 170 may cover the ohmic contacts 151 and 220, the gate 140, and the contact region 230. The drain metal 180 may cover an opposite surface of the substrate 101.

As described above, in the unit cell C, the gate 140 may have a hexagonal shape. In addition, the well 120 may be below the gate 140. In addition, the source 130 may be in the well 120 and in contact with the well 120. The source 130 may have, for example, a substantially hexagonal shape. In addition, the first high concentration impurity region 150 may be in the center of the unit cell C. The first high concentration impurity region 150 may have, for example, a substantially hexagonal shape. Finally, the JFET region 160 may be below the gate 140. The JFET region 160 may have, for example, a substantially hexagonal shape. As described above, it should be noted that the shape of each component is exemplary for description of the present disclosure.

The foregoing detailed description may be merely an example of the present disclosure. Also, the inventive concept is explained by describing various embodiments and may be used in various combinations, modifications, and environments. That is, the inventive concept may be amended or modified without departing from the scope of the technical idea and/or knowledge in the art. The foregoing embodiments are for illustrating various modes for implementing the technical idea of the present disclosure, and various modifications may be made therein according to specific application fields and/or uses of the present disclosure. Therefore, the foregoing detailed description of the present disclosure is not intended to limit the inventive concept to the disclosed embodiments.

What is claimed is:

1. A semiconductor device, comprising:
a substrate including a MOSFET region and a Schottky barrier diode (SBD) region;
a lightly doped second conductivity type drift region on the substrate in the MOSFET region and the SBD region;
a first conductivity type well in the drift region in the MOSFET region;
a heavily doped second conductivity type source in the well;
a gate in the MOSFET region and comprising a gate insulating film on the drift region and a gate electrode on the gate insulating film;
a junction gate field-effect transistor (JFET) region in the drift region and below the gate;
a first high concentration impurity region in contact with the source and the well in the MOSFET region and the JFET region, the first high concentration impurity region having a first conductive type;
a first ohmic contact at least partially in contact with the source and the first high concentration impurity region; and
a second high concentration impurity region in the drift region in the SBD region, the second high concentration impurity region having the first conductivity type.

2. The semiconductor device of claim 1, wherein the JFET region surrounds or is in contact with one sidewall and a lowermost surface of the well.

3. The semiconductor device of claim 1, further comprising a second ohmic contact on the second high concentration impurity region in the SBD region.

4. The semiconductor device of claim 1, further comprising a contact region on the drift region in the SBD region.

5. A semiconductor device, comprising:
a substrate having a plurality of MOSFET regions and one or more Schottky barrier diode (SBD) regions;
a lightly doped second conductivity type drift region on the substrate in the MOSFET regions and the one or more SBD regions; and
a plurality of unit cells having a first substantially hexagonal shape and at least a partial honeycomb structure, the unit cells comprising the MOSFET regions;
wherein the one or more SBD regions are between at least two of the unit cells and have a second substantially hexagonal shape,
each of the unit cells comprises a first high concentration impurity region surrounded by the source in the drift region, the first high concentration impurity region having a first conductivity type, and
the one or more SBD regions comprises a second high concentration impurity region in the drift region, the second high concentration impurity region having the first conductivity type.

6. The semiconductor device of claim 5, wherein each of the unit cells further comprises:
a gate having a third substantially hexagonal shape;
a well in the drift region and below the gate;
a source in contact with the well in the drift region; and
a junction gate field-effect transistor (JFET) region in the drift region and below the gate.

7. The semiconductor device of claim 5, comprising a plurality of the SBD regions, wherein the SBD regions are not in contact with each other.

8. The semiconductor device of claim 5, wherein the one or more SBD regions has six outer surfaces in contact with respective unit cells.

9. The semiconductor device of claim 6, wherein the one or more SBD regions further comprises:

a second ohmic contact on the second high concentration impurity region.

10. The semiconductor device of claim 9, further comprising:

a source metal or source electrode covering the gate on the drift region; and a drain metal or drain electrode under the substrate.

11. A semiconductor device, comprising:

a substrate having a plurality of MOSFET regions and one or more Schottky barrier diode (SBD) regions;

a lightly doped second conductivity type drift region on the substrate in the MOSFET regions and the one or more SBD regions; and a plurality of unit cells having a first substantially hexagonal shape and at least a partial honeycomb structure, and arranged in n columns, the unit cells comprising the MOSFET regions;

wherein the one or more SBD regions are between two or more of the unit cells, have a second substantially hexagonal shape, and are not in adjacent ones of the n columns, each of the unit cells comprises a first high concentration impurity region surrounded by the source in the drift region, the first high concentration impurity region having a first conductivity type, and the one or more SBD regions comprises a second high concentration impurity region in the drift region, the second high concentration impurity region having the first conductivity type.

12. The semiconductor device of claim 11, wherein each of the one or more SBD regions is directly surrounded by a subset of the plurality of the unit cells.

13. The semiconductor device of claim 11, wherein the one or more SBD regions alternate with the unit cells in at least one of the n columns.

14. The semiconductor device of claim 13, wherein the SBD regions have an area equal to or less than 25% or less of a total area of an active region.

15. The semiconductor device of claim 5, wherein each of the unit cells further comprises a first ohmic contact at least partially in contact with the source and the first high concentration impurity region.

16. The semiconductor device of claim 15, wherein the one or more SBD regions further comprises a second ohmic contact on the second high concentration impurity region.

17. The semiconductor device of claim 11, wherein each of the unit cells further comprises a first ohmic contact at least partially in contact with the source and the first high concentration impurity region.

18. The semiconductor device of claim 17, wherein the one or more SBD regions further comprises a second ohmic contact on the second high concentration impurity region.

19. A semiconductor device, comprising:

a substrate having a plurality of MOSFET regions and one or more Schottky barrier diode (SBD) regions;

a lightly doped second conductivity type drift region on the substrate in the MOSFET regions and the one or more SBD regions; and a plurality of unit cells having a first substantially hexagonal shape and at least a partial honeycomb structure, the unit cells comprising the MOSFET regions;

wherein:

the one or more SBD regions are between at least two of the unit cells and have a second substantially hexagonal shape, each of the unit cells further comprises:

a gate having a third substantially hexagonal shape;

a well in the drift region and below the gate;

a source in contact with the well in the drift region;

a first high concentration impurity region surrounded by the source in the drift region, the first high concentration impurity region having a first conductivity type; and a JFET region in the drift region and below the gate; and the one or more SBD regions further comprises:

a second high concentration impurity region in the drift region, the second high concentration impurity region having the first conductivity type; and a second ohmic contact on the second high concentration impurity region.

20. The semiconductor device of claim 19, further comprising a source metal or source electrode covering the gate on the drift region, and a drain metal or drain electrode under the substrate.

\*   \*   \*   \*   \*